(12) United States Patent
Lu et al.

(10) Patent No.: US 10,212,817 B2
(45) Date of Patent: Feb. 19, 2019

(54) ELECTRONIC MODULE WITH A MAGNETIC DEVICE

(71) Applicant: CYNTEC CO., LTD., Hsinchu (TW)

(72) Inventors: Chun Hsien Lu, Hsinchu (TW); Bau-Ru Lu, Hsinchu (TW); Kaipeng Chiang, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 15/414,602

(22) Filed: Jan. 24, 2017

(65) Prior Publication Data

US 2017/0223835 A1  Aug. 3, 2017

Related U.S. Application Data

(60) Provisional application No. 62/288,459, filed on Jan. 29, 2016.

(51) Int. Cl.
| | |
|---|---|
| *H01F 27/29* | (2006.01) |
| *H01F 5/00* | (2006.01) |
| *H05K 1/18* | (2006.01) |
| *H01F 27/06* | (2006.01) |

(52) U.S. Cl.
CPC .............. *H05K 1/181* (2013.01); *H01F 5/00* (2013.01); *H01F 27/06* (2013.01); *H01F 27/29* (2013.01); *H01F 27/292* (2013.01); *H01F 2027/065* (2013.01); *H01F 2027/297* (2013.01); *H05K 2201/1003* (2013.01); *H05K 2201/10015* (2013.01); *H05K 2201/10022* (2013.01); *H05K 2201/10166* (2013.01); *H05K 2201/10174* (2013.01)

(58) Field of Classification Search
CPC .......................... H01F 5/00; H01F 27/00–27/36
USPC .................... 336/65, 83, 107, 192, 200, 232
See application file for complete search history.

(56) References Cited

U.S. PATENT DOCUMENTS

| | | | | |
|---|---|---|---|---|
| 5,034,854 A | * | 7/1991 | Matsumura | H01F 27/292 336/192 |
| 5,621,636 A | * | 4/1997 | Tanigawa | H01F 19/04 363/147 |
| 2009/0175014 A1 | * | 7/2009 | Zeng | H01F 27/29 361/782 |
| 2012/0014079 A1 | * | 1/2012 | Chen | H05K 1/181 361/782 |
| 2012/0293291 A1 | * | 11/2012 | Cheng | H01F 27/292 336/65 |
| 2014/0251669 A1 | * | 9/2014 | Manusharow | H01L 23/13 174/260 |

* cited by examiner

*Primary Examiner* — Tuyen Nguyen
(74) *Attorney, Agent, or Firm* — Min-Lee Teng; Litron Patent & Trademark Office

(57) ABSTRACT

An electronic module is provided. The electronic module includes: a magnetic device having a magnetic body, electronic devices, and a substrate, wherein a first lead extends out from a first lateral surface and a second lead extends out from a second lateral surface opposite to the first lateral surface of the magnetic body and the substrate and the second lead of the magnetic device are located at a same lateral side of the magnetic body and the second lead is extended from the second lateral surface of the magnetic body to the substrate to electrically connect the magnetic device and the substrate.

17 Claims, 11 Drawing Sheets

ELECTRONIC MODULE WITH A MAGNETIC DEVICE

CROSS-REFERENCE TO RELATED APPLICATIONS

The present application claims the benefit of U.S. Provisional Application Ser. No. 62/288,459 filed on Jan. 29, 2016, the entirety of which is incorporated by reference herein.

BACKGROUND OF THE INVENTION

Field of the Invention

The invention relates to an electronic module with a magnetic device and methods for forming a package structure thereof.

Description of the Related Art

An electronic modules, such as power modules and buck converters, typically include electronic devices disposed on a substrate, wherein the electronic module has leads for connecting with an external circuit.

As shown in FIG. 1, an electronic module 100 comprises a magnetic device 110 disposed on a substrate 150. Leads 122 of the magnetic device 110 are soldered to the substrate 150. In the conventional electronic structure of FIG. 1, the substrate 150 needs to be staked over the external motherboard 160, and it will be difficult to meet different space requirements when connecting the electronic module 100 with the external motherboard 160 for some applications. Furthermore, with reference to FIG. 2, each lead of the magnetic device 210 needs to go through the substrate 150 for electrically connecting with the external motherboard 160, and thus it will increase the overall impedance of the system.

Accordingly, there is a demand for finding a better packaging structure to solve the aforementioned problems.

SUMMARY OF THE INVENTION

A detailed description is given in the following embodiments with reference to the accompanying drawings.

One objective of present invention is to provide different ways to connect an electronic module to an external motherboard to meet different space requirements.

One objective of present invention is to allow a lead of the magnetic device to be electrically connected to an external motherboard without using an intermediate substrate that is disposed between the magnetic device and the external motherboard, and thus it will decrease the overall impedance of the system.

In one embodiment, an electronic module is disclosed, wherein the electronic module comprises: a magnetic device, comprising a body having a top surface, a bottom surface, a first lateral surface and a second lateral surface opposite to the first lateral surface, wherein the magnetic device comprises a first lead and a second lead, and the second lead is extended outside of the body from the second lateral surface; and a substrate, having a top surface and a bottom surface, wherein at least one electronic device is disposed on the top surface or the bottom surface of the substrate, wherein the substrate and the second lead are located at a same lateral side of the body of the magnetic device with respect to the second lateral surface, wherein the second lead is extended from the second lateral surface of the body to the substrate to electrically connect the magnetic device to the substrate, wherein the first lead of the magnetic device is not in contact with the first substrate for connecting with an external circuit.

In one embodiment, a coil is embedded inside of the magnetic body, wherein the first and the second lead are respectively electrically connected to two ends of the coil.

In one embodiment, a metal strip is embedded in the magnetic body to form an inductor, and the first lead and the second lead are integrally formed with the metal strip embedded in the magnetic body.

In one embodiment, the magnetic device comprises a plurality of inductors, and each inductor has a corresponding metal strip embedded in the magnetic body, and wherein a groove is located on a top surface of the magnetic body between each two adjacent metal strips and one end of each of the embedded metal strip extends out from the first lateral surface of the magnetic body and the other end of each of the embedded metal strip extends out from the second lateral surface opposite to the first lateral surface of the magnetic body and electrically connects with the substrate.

In one embodiment, at least one metal strip is embedded in the magnetic body, and the magnetic body comprises an I core and a U core, and wherein the at least one metal strip is embedded inside of the U core with the I core disposed on the U core.

In one embodiment, the substrate is a PCB or a ceramic substrate, metallic substrate or a lead frame.

In one embodiment, at least one electronic device is disposed on a top surface of the substrate.

In one embodiment, at least one first electronic device is disposed on a top surface of the substrate, and at least one second electronic device is disposed on a bottom surface of the substrate.

In one embodiment, the electronic module further comprises a molding body encapsulating the magnetic body and the substrate.

In one embodiment, a top surface of the magnetic body is exposed to the outside of the molding body.

In one embodiment, the electronic module is connected to an external motherboard with a bottom surface of the magnetic body facing a top surface of the motherboard.

In one embodiment, the electronic module is connected to an external motherboard with the first lateral surface of the magnetic body facing a top surface of the motherboard.

In one embodiment, an electronic module is disclosed, wherein the electronic module comprises: an inductor, comprising a magnetic body having a top surface, a bottom surface, a first lateral surface and a second lateral surface opposite to the first lateral surface, the inductor comprises a first lead and a second lead, and the second lead is extended outside of the body from the second lateral surface; and a substrate, having a top surface and a bottom surface, wherein at least one electronic device is disposed on the top surface or the bottom surface of the substrate, and the second lead is extended from the second lateral surface of the magnetic body to the substrate to electrically connect the inductor to the substrate, wherein the first lead of the inductor is not in contact with the first substrate for connecting with an external circuit.

In one embodiment, a coil is embedded inside of the magnetic body, wherein the first and the second lead are respectively electrically connected to two ends of the coil.

In one embodiment, a metal strip is embedded in the magnetic body to form the inductor, and the first lead and the second lead are integrally formed with the metal strip embedded in the magnetic body.

In one embodiment, the inductor comprises a plurality of metal strips embedded in the magnetic body, wherein one end of each of the embedded metal strip extends out from the first lateral surface of the magnetic body and the other end of each of the embedded metal strip extends out from the second lateral surface opposite to the first lateral surface of the magnetic body and electrically connects with the substrate.

In one embodiment, the electronic module is connected to an external motherboard with a bottom surface of the magnetic body facing a top surface of the motherboard.

In one embodiment, the electronic module is connected to an external motherboard with the first lateral surface of the magnetic body facing a top surface of the motherboard.

In one embodiment, a package structure is disclosed, wherein package structure comprises: a lead frame, wherein the lead frame has at least one metal strip and a plurality of metal leads, wherein a magnetic body encapsulates a portion of each of the at least one metal strip with two ends of each of the at least one metal strip exposed outside the magnetic body; and a substrate, disposed on the lead frame, wherein the substrate is electrically connected to one end of each of the plurality of metal leads and one end of each of the at least one metal strip, and wherein the other end of each of the plurality of metal leads and the other end of each of the at least one metal strip are used for connecting with an external circuit.

In one embodiment, the magnetic body comprises a first magnetic core on a top surface of the at least one metal strip and a second magnetic core on a bottom surface of the at least one metal strip to form a magnetic device comprising the first and second magnetic cores and the at least one metal strip.

In one embodiment, the substrate is disposed in space surrounded by the plurality of metal leads and the at least one metal strip, and wherein the substrate has a plurality of contacts that are electrically connected with the plurality of metal leads and the at least one metal strip.

In one embodiment, the magnetic device is an inductor.

In one embodiment, the magnetic device is an inductor and the inductor comprises a coil embedded inside of the magnetic body.

In one embodiment, there is a plurality of metal strips and each of the metal strips and a corresponding portion of the first and second magnetic cores form an inductor.

In one embodiment, there are six metal strips and each of the six metal strips and a corresponding portion of the first and second magnetic cores form an inductor, and wherein a groove is located between each two corresponding portions of the magnetic cores.

In one embodiment, at least one electronic device is disposed on a top surface of the substrate.

In one embodiment, the package structure of claim further comprises a molding body encapsulating the magnetic body and the substrate.

In one embodiment, a top surface of the first magnetic core is exposed to the outside of the molding body.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

Figure 1:
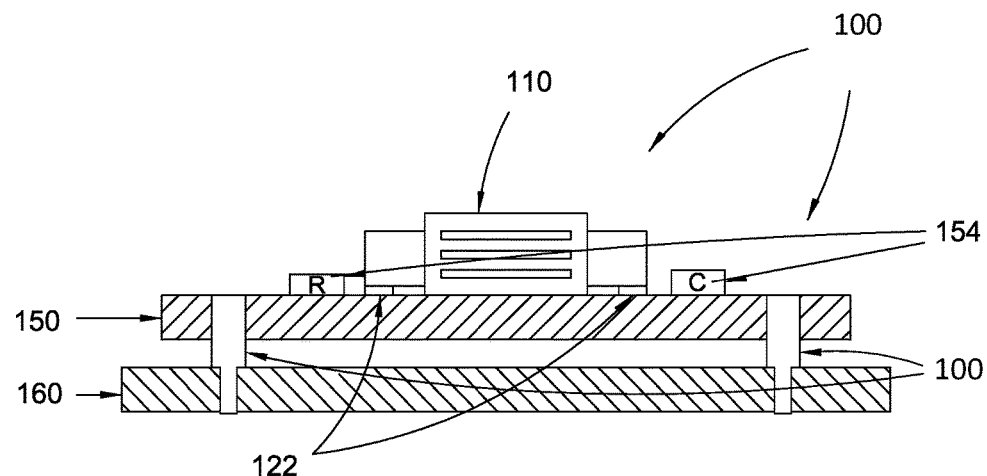
FIG. 1 is a side view of an electronic structure in accordance with the prior art.
Figure 2:
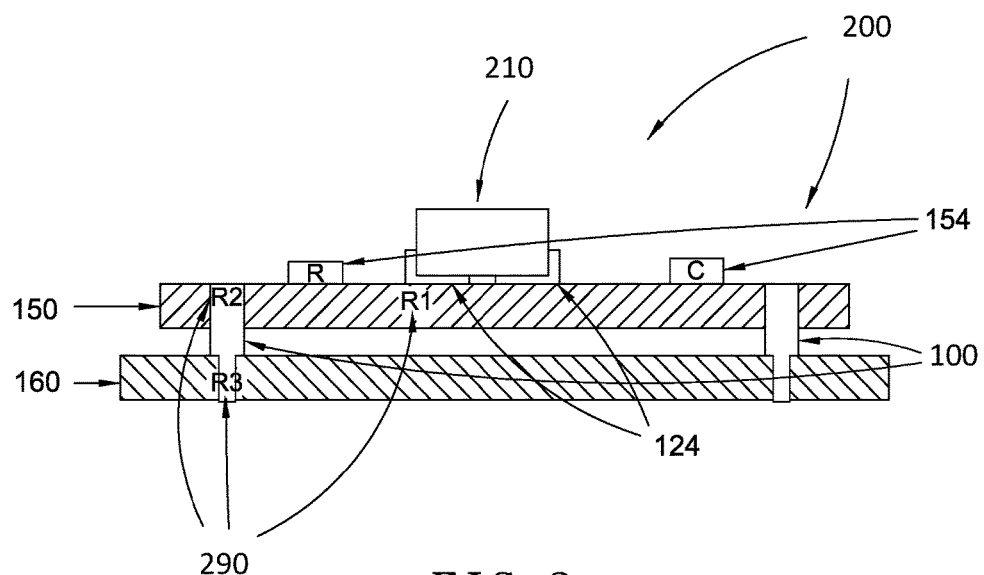
FIG. 2 is a partial schematic, side view of an electronic structure in accordance with another prior art.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 3A:
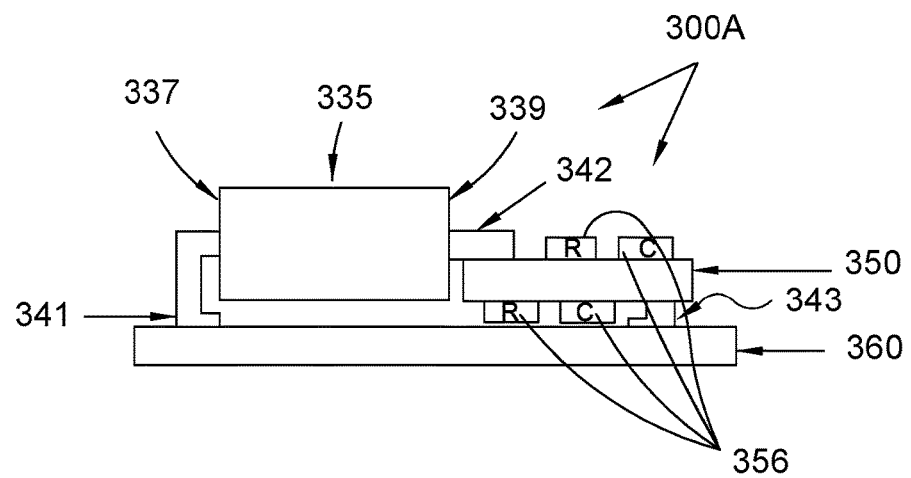
FIG. 3A is a side view of an electronic module in accordance with an embodiment of the invention, attached to an external motherboard.

FIG. 3A is a partial schematic, side view of an electronic module in accordance with an embodiment of the invention, attached to an external motherboard. As shown in FIG. 3A, the electronic module 300A includes a magnetic device having a body, such as a magnetic body 335 and a substrate 350 having circuits therein. Please note that the body is not limited to a magnetic body. The magnetic device may comprise an inductor or choke. A first lead 341 extends out from a first lateral surface 337 and a second lead 342 extends out from a second lateral surface 339 opposite to the first lateral surface 337 of the magnetic body 335. The substrate 350 can be a PCB or a ceramic substrate, metallic substrate or a lead frame and can be a two-layered or multi-layered substrate. The substrate 350 and the second lead 342 of the magnetic device are located at a same lateral side of the magnetic body 335. The second lead 342 of the magnetic device is electrically connected to the substrate 350. The substrate 350 may comprise electronic devices 356 and the electronic devices 356 can be passive and active devices used in any combination. The electronic devices 356 can be disposed on a top and bottom surface of the substrate 350, respectively. Please note that the first lead 341 of the magnetic device can be electrically connected to an external motherboard without being in contact with the substrate 350, and thus it will decrease the overall impedance of the system.

Still, referring to the embodiment of FIG. 3A the electronic module 300A can be electrically connected to an external motherboard 360 with a bottom surface of the magnetic body 335 facing a top surface of the external motherboard 360. The first lead 341 of the magnetic device can be directly soldered to the external motherboard 360 along with a third lead 343 of the substrate 350, using conductive materials such as copper, aluminum or silver. As shown in FIG. 3A, the electronic module 300A is assembled as a plastic leaded chip carrier (PLCC). Accordingly, the first lead 341 of the magnetic device and the third lead 343 of the substrate 350 can be directly soldered to the external motherboard 360 using surface mount technology (SMT). However, the package assembly types and soldering technologies are not limited thereto. Other package assembly types and soldering technologies can be used to package the electronic modules of the invention and electrically connect the electronic modules to an external motherboard.

Figure 3B:
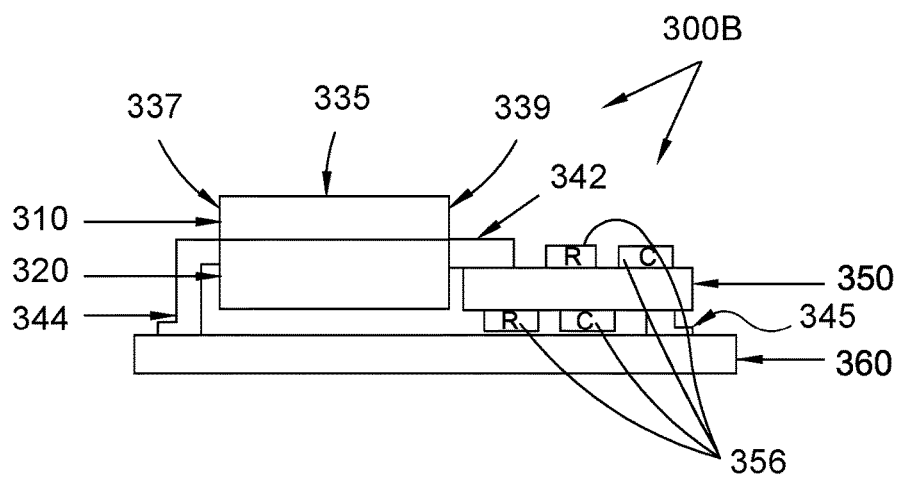
FIGS. 3B, 3C and 3D are side views of additional embodiments of the electronic module of FIG. 3A of the invention, assembled using QFP, DIP and SIP packaging, respectively, for electrical connections.
Figure 3C:
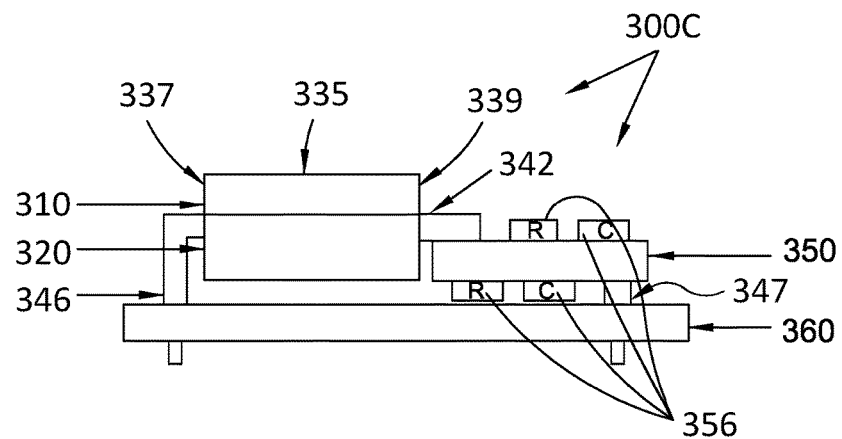
Figure 3D:
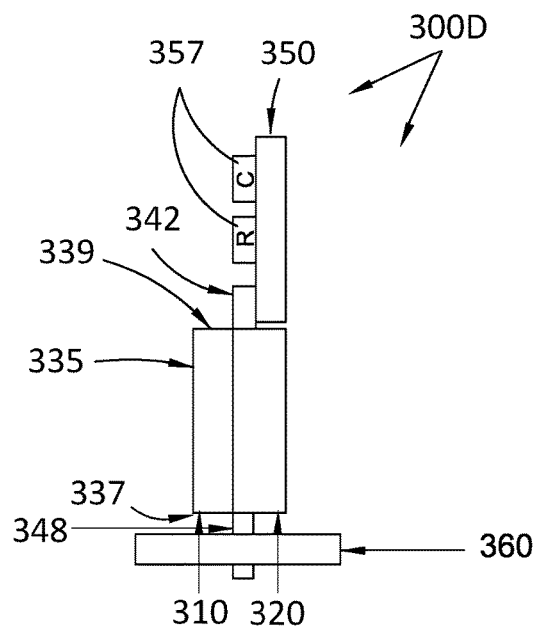

FIGS. 3B, 3C and 3D are partial schematic, side views of additional embodiments of the electronic module of FIG. 3A of the invention, attached to an external motherboard and assembled using QFP, DIP and SIP packaging, respectively, for electrical connections. Accordingly, the differences in the embodiment of FIG. 3A and the embodiments of FIGS. 3B, 3C, and 3D, are mainly the package assembly type of the electronic modules 300B, 300C and 300D. As shown in FIGS. 3B, 3C and 3D, in the embodiments of the electronic modules 300B, 300C and 300D of the invention, the electronic modules 300B, 300C and 300D include a magnetic device having a body such as magnetic body 335 and a substrate 350 having circuits therein. Each of First leads 344, 346 and 348 of the electronic modules 300B, 300C and 300D, are integrally formed with the at least one metal strip embedded in the magnetic body 335. The first leads 344, 346 and 348, extend out from a first lateral surface 337. Meanwhile, a second lead 342 of the magnetic devices of the electronic modules 300B, 300C and 300D is integrally formed with each of the at least one metal strip embedded in the magnetic body 335 and extends out from a second lateral surface 339 opposite to the first lateral surface 337 of the magnetic body 335. In the embodiments, the substrate 350 and the second lead 342 of the magnetic devices are located at a same lateral side of the magnetic body 335. The substrate 350 of FIGS. 3B and 3C, respectively, may comprise electronic devices 356 and the substrate 350 of FIG. 3D may comprise electronic devices 357.

Still, referring to the embodiments of the electronic modules 300B, 300C and 300D of FIGS. 3B, 3C and 3D, respectively, the electronic modules 300B, 300C and 300D can be electrically connected to an external motherboard 360 with a bottom surface of the magnetic body 335 facing a top surface of the external motherboard 360 for the embodiments of FIGS. 3B and 3C, and the first lateral surface 337 of the magnetic body 335 facing a top surface of the external motherboard 360 for the embodiment of FIG. 3D. The first lead 341 of the magnetic devices of FIGS. 3B, 3C, and 3D, respectively, can be directly soldered to the external motherboard 360. As shown in FIG. 3B, the electronic module 300B is assembled as a quad flat package (QFP). Accordingly, the first lead 344 of the magnetic device and the third lead 345 of the substrate 350 can be directly soldered to the external motherboard 360 using surface mount technology (SMT). Meanwhile, as shown in FIG. 3C, the electronic module 300C is assembled as a dual in-line package (DIP), wherein the first lead 346 of the magnetic device and the third lead 347 of the substrate 350 can be directly soldered to the external motherboard 360 using through hole technology (THT). For the electronic module 300D of FIG. 3D, the electronic module 300D is assembled as a single in-line package (SIP), wherein the first lead 348 of the magnetic device can be directly soldered to the external motherboard 360 using through hole technology (THT). As for the additional embodiments of FIG. 3A, which may also be applied to the embodiments of FIGS. 3B, 3C and 3D, they will not be repeated again for brevity.

Figure 4A:
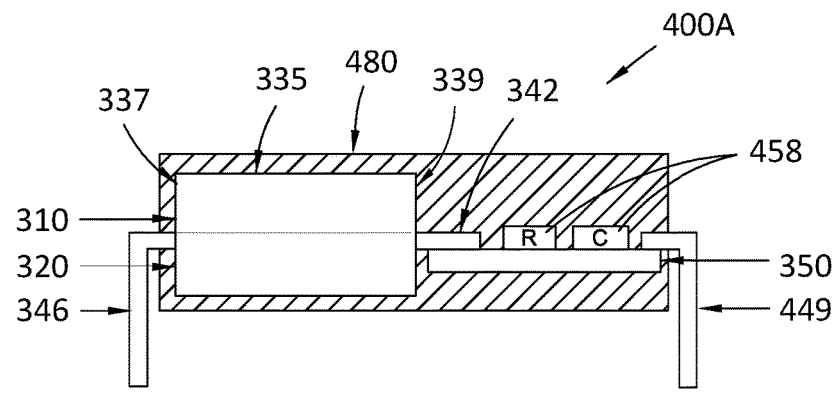
FIG. 4A is a side view of an electronic module in accordance with another embodiment of the invention.

FIG. 4A is a partial schematic, side view of an electronic module in accordance with another embodiment of the invention. The main difference in the embodiment of the electronic module 300A of FIG. 3A and the embodiment of the electronic module 400A of FIG. 4A, is that the electronic module 400A of FIG. 4A, further comprises a molding body 480, encapsulating the magnetic device and the substrate 350. The molding body 480 may comprise epoxy resin, but the invention is not limited thereto. Additionally, in the embodiment of the electronic module 400A of FIG. 4A, no external motherboard is shown. As shown in FIG. 4A, in the embodiment of the electronic module 400A, the electronic module 400A comprises a magnetic device having a magnetic body 335 and a substrate 350 having circuits therein. In one embodiment, a first lead 346 of the electronic module 400A is integrally formed with the at least one metal strip embedded in the magnetic body 335. The first lead 346 extends out from a first lateral surface 337. In one embodiment, a second lead 342 of the magnetic device of the electronic module 400A, is integrally formed with each of the at least one metal strip embedded in the magnetic body 335 and extends out from a second lateral surface 339 opposite to the first lateral surface 337 of the magnetic body 335. In the embodiment, the substrate 350 and the second lead 342 of the magnetic device is located at a same lateral side of the magnetic body 335. The substrate 350 may comprise electronic devices 458 and a pin 449 for connecting with the motherboard. Please note that the first lead 346 of the magnetic device can be electrically connected to an external motherboard without being in contact with the substrate 350, and thus it will decrease the overall impedance of the system.

Still, referring to the embodiment of the electronic module 400A of FIG. 4A, the electronic module 400A can be assembled as a dual in-line package (DIP). However, the invention is not limited thereto. In further embodiments, the electronic module can be assembled by other package types.

Figure 4B:
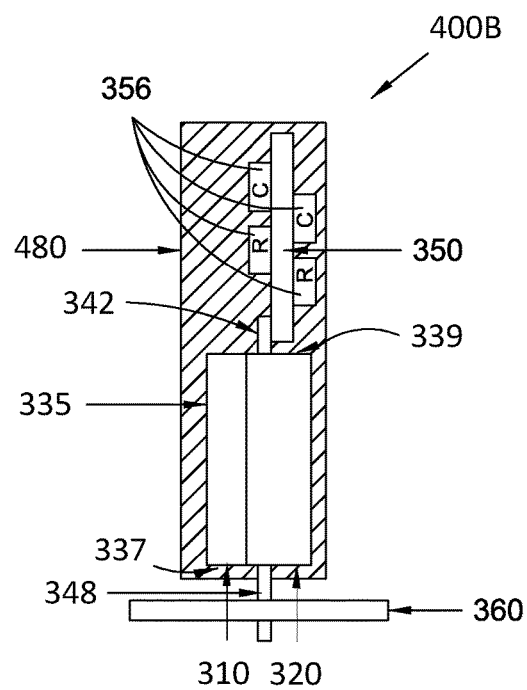
FIG. 4B is a side view of an additional embodiment of the electronic module of FIG. 4A of the invention, attached to an external motherboard and assembled using SIP packaging for electrical connections.

FIG. 4B is a partial schematic, side view of an additional embodiment of the electronic module of FIG. 4A of the invention, attached to an external motherboard and assembled using SIP packaging for electrical connections. The main difference in the embodiment of the electronic module 400A of FIG. 4A and the embodiment of the electronic module 400B of FIG. 4B, is the package assembly type of the electronic module 400B. Additionally, in the embodiment of the electronic module 400B of FIG. 4B, the electronic module 400B is electrically connected to an external motherboard 360. As shown in FIG. 4B, in the embodiment of the electronic module 400B of the invention, the electronic module 400B comprises a magnetic device having a magnetic body 335 and a substrate 350 having circuits therein. A molding body 480, encapsulates the magnetic device and the substrate 350. A first lead 348 of the electronic module 400B is integrally formed with the at least one metal strip embedded in the magnetic body 335. The first lead 348 extends out from a first lateral surface 337. In one embodiment, a second lead 342 of the magnetic device of the electronic module 400B, is integrally formed with each of the at least one metal strip embedded in the magnetic body 335 and extends out from a second lateral surface 339 opposite to the first lateral surface 337 of the magnetic body 335. In the embodiment, the substrate 350 and the second lead 342 of the magnetic device is located at a same lateral side of the magnetic body 335. The substrate 350 may comprise electronic devices 356.

Still, referring to the embodiment of the electronic module 400B, the electronic modules 400B can be electrically connected to an external motherboard 360 with the first lateral surface 337 of the magnetic body 335 facing a top surface of the external motherboard 360. The first lead 348 of the magnetic devices of FIG. 4B, can be directly soldered to the external motherboard 360. As shown in FIG. 4B, the electronic module 400B is assembled as a single in-line package (SIP), wherein the first lead 348 of the magnetic device can be directly soldered to the external motherboard 360 using through hole technology (THT). However, the package assembly types and soldering technologies are not limited thereto. Other package assembly types and soldering technologies can be used to package the electronic modules of the invention and electrically connect the electronic modules to an external motherboard. As for the additional embodiments of FIG. 4A, which may also be applied to the embodiments of FIG. 4B, they will not be repeated again for brevity.

In the embodiments, with the addition of the molding body 480, the magnetic device having the magnetic body 335, substrate 350, and electronic devices 458, 356, respectively, are protected from damage due to pressure and moisture. Additionally, the molding body 480 provides a more efficient heat dissipation path for the electronic devices 458, 356, respectively.

Figure 5A:
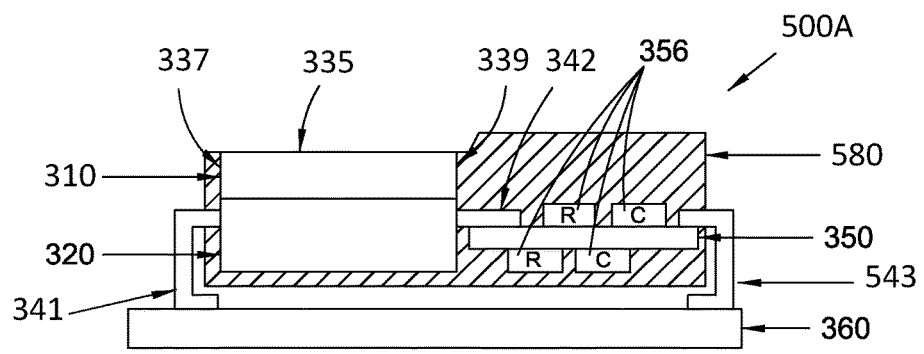
FIG. 5A is a side view of an electronic module in accordance with yet another embodiment of the invention, attached to an external motherboard.

FIG. 5A is a partial schematic, side view of an electronic module in accordance with yet another embodiment of the invention, attached to an external motherboard. The main difference in the embodiment of the electronic module 500A of FIG. 5A and the embodiment of the electronic module 300A of FIG. 3A, is that a top surface of the magnetic body 335 of the electronic module 500A of FIG. 5A is exposed to the outside of the molding body 580. As shown in FIG. 5A, in the embodiment of the electronic module 500A, the electronic module 500A includes a magnetic device having a magnetic body 335 and a substrate 350 having circuits therein. A first lead 341 of the electronic module 500A is integrally formed with the at least one metal strip embedded in the magnetic body 335. The first lead 341 extends out from a first lateral surface 337. In one embodiment, a second lead 342 of the magnetic device of the electronic module 500A, is integrally formed with each of the at least one metal strip embedded in the magnetic body 335 and extends out from a second lateral surface 339 opposite to the first lateral surface 337 of the magnetic body 335. In the embodiment, the substrate 350 and the second lead 342 of the magnetic device is located at a same lateral side of the magnetic body 335. The substrate 350 may comprise electronic devices 356.

Still, referring to the embodiment of FIG. 5A the electronic module 500A can be electrically connected to an external motherboard 360 with a bottom surface of the magnetic body 335 facing a top surface of the external motherboard 360. The first lead 341 of the magnetic device can be directly soldered to the external motherboard 360 along with a third lead 543 of the substrate 350, using conductive materials such as copper, aluminum or silver. As shown in FIG. 5A, the electronic module 500A is assembled as a plastic leaded chip carrier (PLCC). Accordingly, the first lead 341 of the magnetic device and the third lead 543 of the substrate 350 can be directly soldered to the external motherboard 360 using surface mount technology (SMT). However, the package assembly types and soldering technologies are not limited thereto. Other package assembly types and soldering technologies can be used to package the electronic modules of the invention and electrically connect the electronic modules to an external motherboard.

Figure 5B:
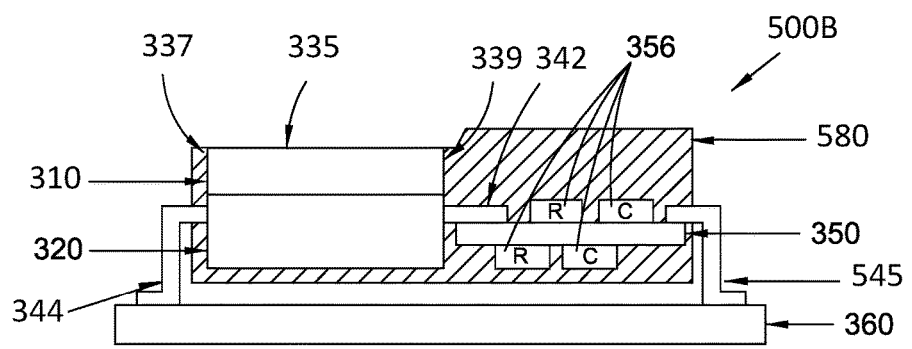
FIGS. 5B, 5C, and 5D are side views of additional embodiments of the electronic module of FIG. 5A of the invention, attached to an external motherboard and assembled using QFP, DIP and SIP packaging, respectively, for electrical connections.
Figure 5C:
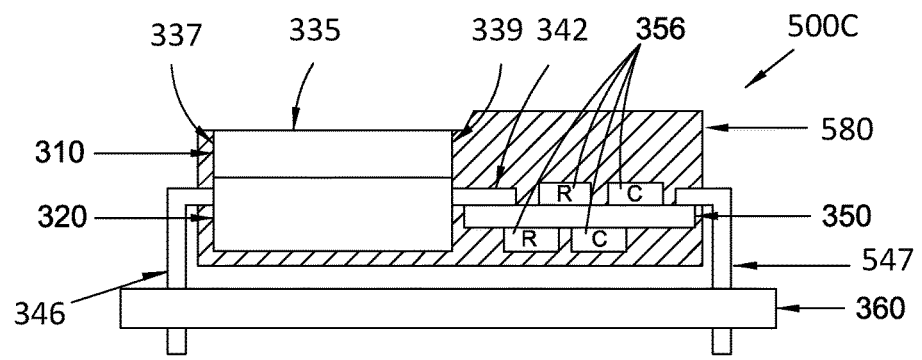
Figure 5D:
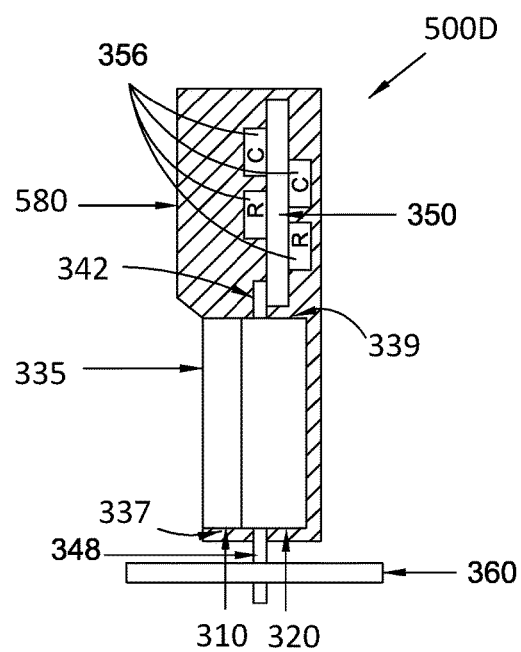

FIGS. 5B, 5C, and 5D are partial schematic, side views of additional embodiments of the electronic module of FIG. 5A of the invention, attached to an external motherboard and assembled using QFP, DIP and SIP packaging, respectively, for electrical connections. Accordingly, the differences in the embodiment of FIG. 5A and the embodiments of FIGS. 5B, 5C, and 5D, are mainly the package assembly type of the electronic modules 500B, 500C and 500D, respectively. As shown in FIGS. 5B, 5C and 5D, in the embodiments of the electronic modules 500B, 500C and 500D of the invention, respectively, the electronic modules 500B, 500C and 500D include a magnetic device having a magnetic body 335 and a substrate 350 having circuits therein. First leads 344, 346 and 348 of the electronic modules 500B, 500C and 500D, respectively, are integrally formed with the at least one metal strip embedded in the magnetic body 335, respectively. The first leads 344, 346 and 348, extend out from a first lateral surface 337. In one embodiment, a second lead 342 of the magnetic devices of the electronic modules 500B, 500C and 500D, respectively, is integrally formed with each of the at least one metal strip embedded in the magnetic body 335 and extends out from a second lateral surface 339 opposite to the first lateral surface 337 of the magnetic body 335. In the embodiments, the substrate 350 and the second lead 342 of the magnetic devices are located at a same lateral side of the magnetic body 335. The substrate 350 of FIGS. 5B, 5C and 5D, respectively, may comprise electronic devices 356.

Still, referring to the embodiments of the electronic modules 500B, 500C and 500D of FIGS. 5B, 5C and 5D, respectively, the electronic modules 500B, 500C and 500D can be electrically connected to an external motherboard 360 with a bottom surface of the magnetic body 335 facing a top surface of the external motherboard 360 for the embodiments of FIGS. 5B and 5C, and the first lateral surface 337 of the magnetic body 335 facing a top surface of the external motherboard 360 for the embodiment of FIG. 5D. The first lead 341 of the magnetic devices of FIGS. 5B, 5C, and 5D, respectively, can be directly soldered to the external motherboard 360. As shown in FIG. 5B, the electronic module 500B is assembled as a quad flat package (QFP). Accordingly, the first lead 344 of the magnetic device and the third lead 545 of the substrate 350 can be directly soldered to the external motherboard 360 using surface mount technology (SMT). In one embodiment, as shown in FIG. 5C, the electronic module 500C is assembled as a dual in-line package (DIP), wherein the first lead 346 of the magnetic device and the third lead 547 of the substrate 350 can be directly soldered to the external motherboard 360 using through hole technology (THT). For the electronic module 500D of FIG. 5D, the electronic module 500D is assembled as a single in-line package (SIP), wherein the first lead 348 of the magnetic device is directly soldered to the external motherboard 360 using through hole technology (THT). As for the additional embodiments of FIG. 5A, which may also be applied to the embodiments of FIGS. 5B, 5C and 5D, they will not be repeated again for brevity.

Figure 6A:
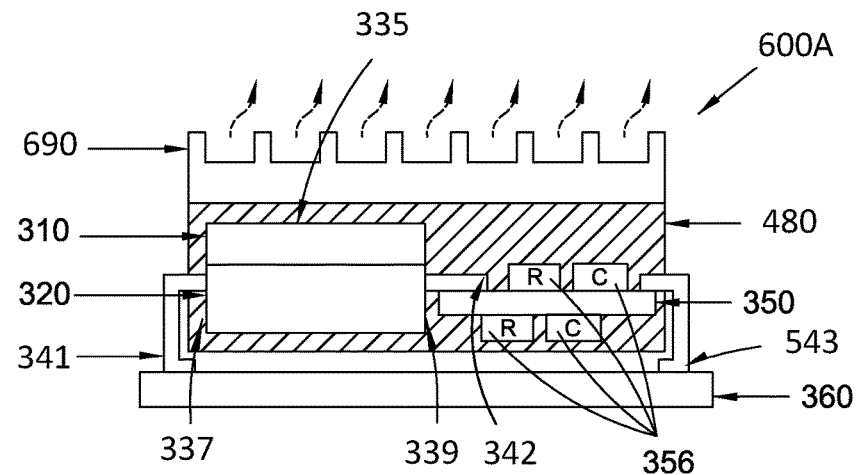
FIG. 6A is a side view of an electronic module in accordance with another embodiment of the invention, attached to an external motherboard.

FIG. 6A is a partial schematic, side view of an electronic module in accordance with another embodiment of the invention, attached to an external motherboard. The main difference in the embodiment of the electronic module 600A of FIG. 6A and the embodiment of the electronic module 400A of FIG. 4A, is that the electronic module 600A of FIG. 6A, further comprise a heat sink 690, disposed on top of the molding body 480. Additionally, in the embodiment of the electronic module 600A of FIG. 6A, the electronic module 600B is electrically connected to an external motherboard 360. As shown in FIG. 6A, in the embodiment of the electronic module 600A, the electronic module 600A includes a magnetic device having a magnetic body 335 and a substrate 350 having circuits therein. A first lead 341 of the electronic module 600A is integrally formed with the at least one metal strip embedded in the magnetic body 335. The first lead 341 extends out from a first lateral surface 337. In one embodiment, a second lead 342 of the magnetic device of the electronic module 600A, is integrally formed with each of the at least one metal strip embedded in the magnetic body 335 and extends out from a second lateral surface 339 opposite to the first lateral surface 337 of the magnetic body 335. In the embodiment, the substrate 350 and the second lead 342 of the magnetic device is located at a same lateral side of the magnetic body 335. The substrate 350 may comprise electronic devices 356.

Still, referring to the embodiment of FIG. 6A the electronic module 600A can be electrically connected to an external motherboard 360 with a bottom surface of the magnetic body 335 facing a top surface of the external motherboard 360. The first lead 341 of the magnetic device can be directly soldered to the external motherboard 360 along with a third lead 543 of the substrate 350, using conductive materials such as copper, aluminum or silver. As shown in FIG. 6A, the electronic module 600A is assembled as a plastic leaded chip carrier (PLCC). Accordingly, the first lead 341 of the magnetic device and the third lead 543 of the substrate 350 can be directly soldered to the external motherboard 360 using surface mount technology (SMT). However, the package assembly types and soldering technologies are not limited thereto. Other package assembly types and soldering technologies can be used to package the electronic modules of the invention and electrically connect the electronic modules to an external motherboard.

Figure 6B:
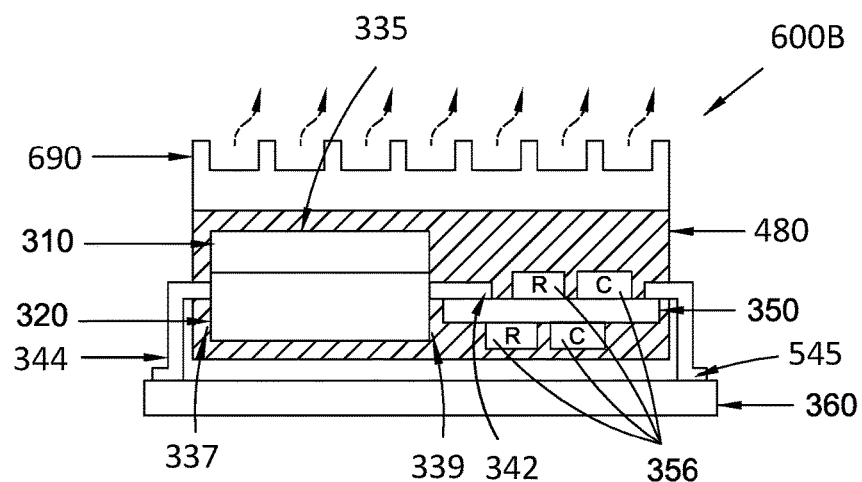
FIGS. 6B, 6C, and 6D are side views of additional embodiments of the electronic module of FIG. 6A of the invention, attached to an external motherboard and assembled using QFP, DIP and SIP packaging, respectively, for electrical connections.
Figure 6C:
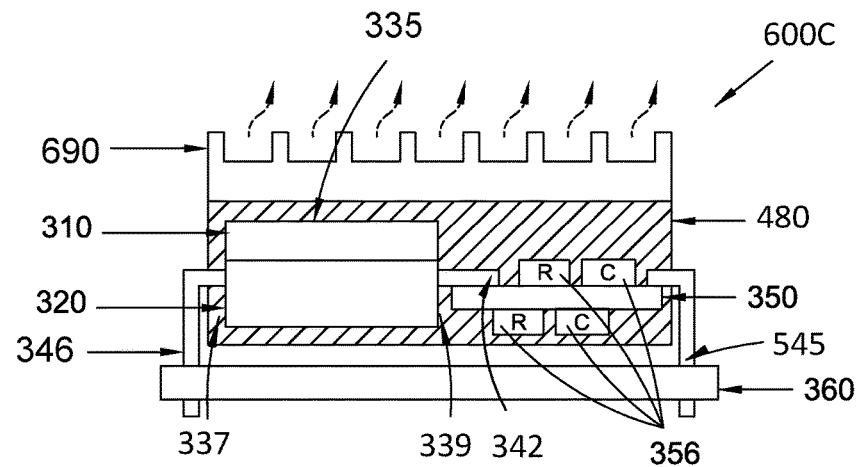
Figure 6D:
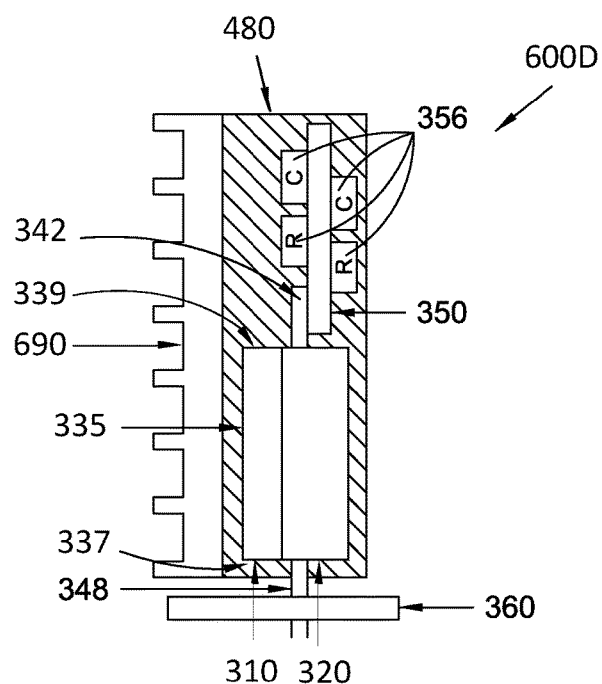

FIGS. 6B, 6C, and 6D are partial schematic, side views of additional embodiments of the electronic module of FIG. 6A of the invention, attached to an external motherboard and assembled using QFP, DIP and SIP packaging, respectively, for electrical connections. Accordingly, the differences in the embodiment of FIG. 6A and the embodiments of FIGS. 6B, 6C, and 6D, are mainly the package assembly type of the electronic modules 600B, 600C and 600D, respectively. As shown in FIGS. 6B, 6C and 6D, in the embodiments of the electronic modules 600B, 600C and 600D of the invention, respectively, the electronic modules 600B, 600C and 600D include a magnetic device having a magnetic body 335 and a substrate 350 having circuits therein. First leads 344, 346 and 348 of the electronic modules 600B, 600C and 600D, respectively, are integrally formed with the at least one metal strip embedded in the magnetic body 335, respectively. The first leads 344, 346 and 348, extend out from a first lateral surface 337. In one embodiment, a second lead 342 of the magnetic devices of the electronic modules 600B, 600C and 600D, respectively, is integrally formed with each of the at least one metal strip embedded in the magnetic body 335 and extends out from a second lateral surface 339 opposite to the first lateral surface 337 of the magnetic body 335. In the embodiments, the substrate 350 and the second lead 342 of the magnetic devices are located at a same lateral side of the magnetic body 335. The substrate 350 of FIGS. 6B, 6C and 6D, respectively, may comprise electronic devices 356.

Still, referring to the embodiments of the electronic modules 600B, 600C and 600D of FIGS. 6B, 6C and 6D, respectively, the electronic modules 600B, 600C and 600D can be electrically connected to an external motherboard 360 with a bottom surface of the magnetic body 335 facing a top surface of the external motherboard 360 for the embodiments of FIGS. 6B and 6C, and the first lateral surface 337 of the magnetic body 335 facing a top surface of the external motherboard 360 for the embodiment of FIG. 6D. The first lead 341 of the magnetic devices of FIGS. 6B, 6C, and 6D, respectively, can be directly soldered to the external motherboard 360. As shown in FIG. 6B, the electronic module 600B is assembled as a quad flat package (QFP). Accordingly, the first lead 344 of the magnetic device and the third lead 545 of the substrate 350 can be directly soldered to the external motherboard 360 using surface mount technology (SMT). In one embodiment, as shown in FIG. 6C, the electronic module 600C is assembled as a dual in-line package (DIP), wherein the first lead 346 of the magnetic device and the third lead 547 of the substrate 350 can be directly soldered to the external motherboard 360 using through hole technology (THT). For the electronic module 600D of FIG. 6D, the electronic module 600D is assembled as a single in-line package (SIP), wherein the first lead 348 of the magnetic device is directly soldered to the external motherboard 360 using through hole technology (THT). As for the additional embodiments of FIG. 6A, which may also be applied to the embodiments of FIGS. 6B, 6C and 6D, they will not be repeated again for brevity.

Figure 7A:
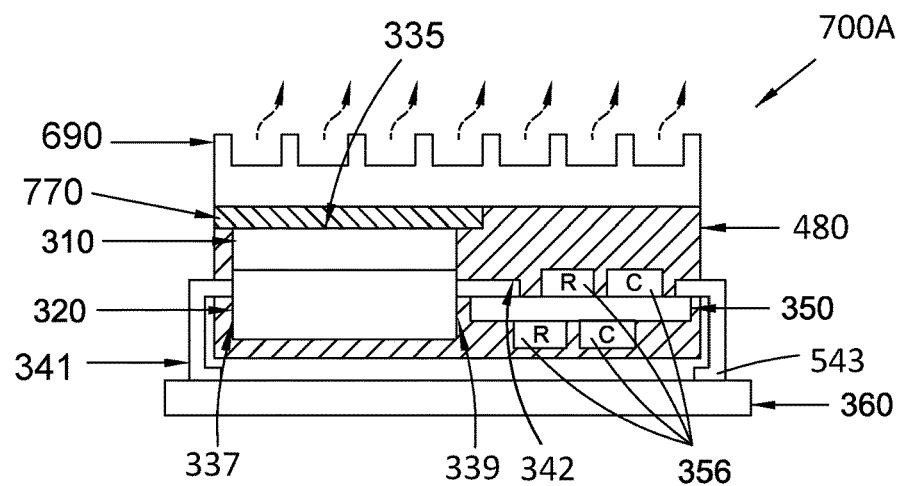
FIG. 7A is a side view of an electronic module in accordance with yet another embodiment of the invention, attached to an external motherboard.

FIG. 7A is a partial schematic, side view of an electronic module in accordance with yet another embodiment of the invention, attached to an external motherboard. The main difference in the embodiment of the electronic module 700A of FIG. 7A and the embodiment of the electronic module 600A of FIG. 6A, is that the electronic module 700A of FIG. 7A, further comprises a thermal interface material 770 disposed on top of the magnetic device 335, between the magnetic device 335 and the heat sink 690. The thermal interface material 770 may comprise a high temperature resistant epoxy resin or high temperature resistant double-sided adhesive tape, but the invention is not limited thereto. As shown in FIG. 7A, in the embodiment of the electronic module 700A, the electronic module 700A includes a magnetic device having a magnetic body 335 and a substrate 350 having circuits therein. A first lead 341 of the electronic module 700A is integrally formed with the at least one metal strip embedded in the magnetic body 335. The first lead 341 extends out from a first lateral surface 337. In one embodiment, a second lead 342 of the magnetic device of the electronic module 700A, is integrally formed with each of the at least one metal strip embedded in the magnetic body 335 and extends out from a second lateral surface 339 opposite to the first lateral surface 337 of the magnetic body 335. In the embodiment, the substrate 350 and the second lead 342 of the magnetic device is located at a same lateral side of the magnetic body 335. The substrate 350 may comprise electronic devices 356.

Still, referring to the embodiment of FIG. 7A the electronic module 700A can be electrically connected to an external motherboard 360 with a bottom surface of the magnetic body 335 facing a top surface of the external motherboard 360. The first lead 341 of the magnetic device can be directly soldered to the external motherboard 360 along with a third lead 543 of the substrate 350, using conductive materials such as copper, aluminum or silver. As shown in FIG. 7A, the electronic module 700A is assembled as a plastic leaded chip carrier (PLCC). Accordingly, the first lead 341 of the magnetic device and the third lead 543 of the substrate 350 can be directly soldered to the external motherboard 360 using surface mount technology (SMT). However, the package assembly types and soldering technologies are not limited thereto. Other package assembly types and soldering technologies can be used to package the electronic modules of the invention and electrically connect the electronic modules to an external motherboard.

Figure 7B:
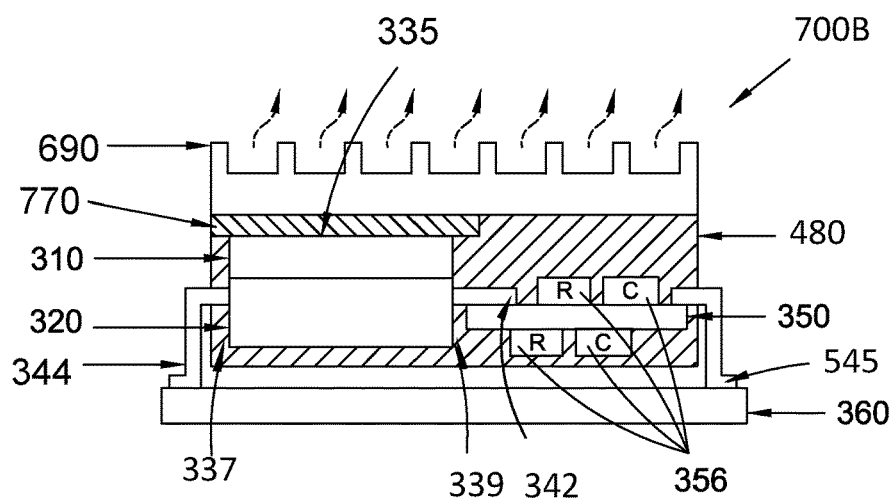
FIGS. 7B, 7C, and 7D are side views of additional embodiments of the electronic module of FIG. 7A of the invention, attached to an external motherboard and assembled using QFP, DIP and SIP packaging, respectively, for electrical connections.
Figures 7C, 7D:
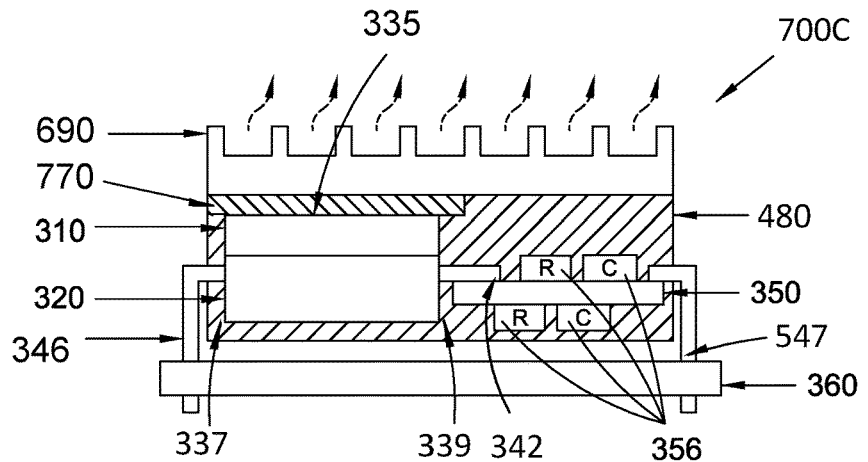

FIGS. 7B, 7C, and 7D are partial schematic, side views of additional embodiments of the electronic module of FIG. 7A of the invention, attached to an external motherboard and assembled using QFP, DIP and SIP packaging, respectively, for electrical connections. Accordingly, the differences in the embodiment of FIG. 7A and the embodiments of FIGS. 7B, 7C, and 7D, are mainly the package assembly type of the electronic modules 700B, 700C and 700D, respectively. As shown in FIGS. 7B, 7C and 7D, in the embodiments of the electronic modules 700B, 700C and 700D of the invention, respectively, the electronic modules 700B, 700C and 700D include a magnetic device having a magnetic body 335 and a substrate 350 having circuits therein. First leads 344, 346 and 348 of the electronic modules 700B, 700C and 700D, respectively, are integrally formed with the at least one metal strip embedded in the magnetic body 335, respectively. The first leads 344, 346 and 348, extend out from a first lateral surface 337. In one embodiment, a second lead 342 of the magnetic devices of the electronic modules 700B, 700C and 700D, respectively, is integrally formed with each of the at least one metal strip embedded in the magnetic body 335 and extends out from a second lateral surface 339 opposite to the first lateral surface 337 of the magnetic body 335. In the embodiments, the substrate 350 and the second lead 342 of the magnetic devices are located at a same lateral side of the magnetic body 335. The substrate 350 of FIGS. 7B, 7C and 7D, respectively, may comprise electronic devices 356.

Still, referring to the embodiments of the electronic modules 700B, 700C and 700D of FIGS. 7B, 7C and 7D, respectively, the electronic modules 700B, 700C and 700D can be electrically connected to an external motherboard 360 with a bottom surface of the magnetic body 335 facing a top surface of the external motherboard 360 for the embodiments of FIGS. 7B and 7C, and the first lateral surface 337 of the magnetic body 335 facing a top surface of the external motherboard 360 for the embodiment of FIG. 7D. The first lead 341 of the magnetic devices of FIGS. 7B, 7C, and 7D, respectively, can be directly soldered to the external motherboard 360. As shown in FIG. 7B, the electronic module 700B is assembled as a quad flat package (QFP). Accordingly, the first lead 344 of the magnetic device and the third lead 545 of the substrate 350 can be directly soldered to the external motherboard 360 using surface mount technology (SMT). In one embodiment, as shown in FIG. 7C, the electronic module 700C is assembled as a dual in-line package (DIP), wherein the first lead 346 of the magnetic device and the third lead 547 of the substrate 350 can be directly soldered to the external motherboard 360 using through hole technology (THT). For the electronic module 700D of FIG. 7D, the electronic module 700D is assembled as a single in-line package (SIP), wherein the first lead 348 of the magnetic device is directly soldered to the external motherboard 360 using through hole technology (THT). As for the additional embodiments of FIG. 7A, which may also be applied to the embodiments of FIGS. 7B, 7C and 7D, they will not be repeated again for brevity.

In the embodiments of the invention, the magnetic device may comprise an inductor, wherein the inductor comprises a coil embedded inside of the magnetic body 335. In yet some other embodiments of the invention, the magnetic device may comprise a plurality of inductors, wherein each inductor has a corresponding metal strip embedded in the magnetic body 335. The magnetic body 335 can be formed by disposing an I core 310 on a U core 320 having at least one metal strip embedded therein. A groove is located on a top surface of the magnetic body 335 between each two adjacent metal strips. One end of each of the embedded metal strip extends out from the first lateral surface 337 of the magnetic body 335 and the other end of each of the embedded metal strip extends out from the second lateral surface 339 opposite to the first lateral surface 337 of the magnetic body 335 and electrically connects with the substrate 350.

Figure 8:
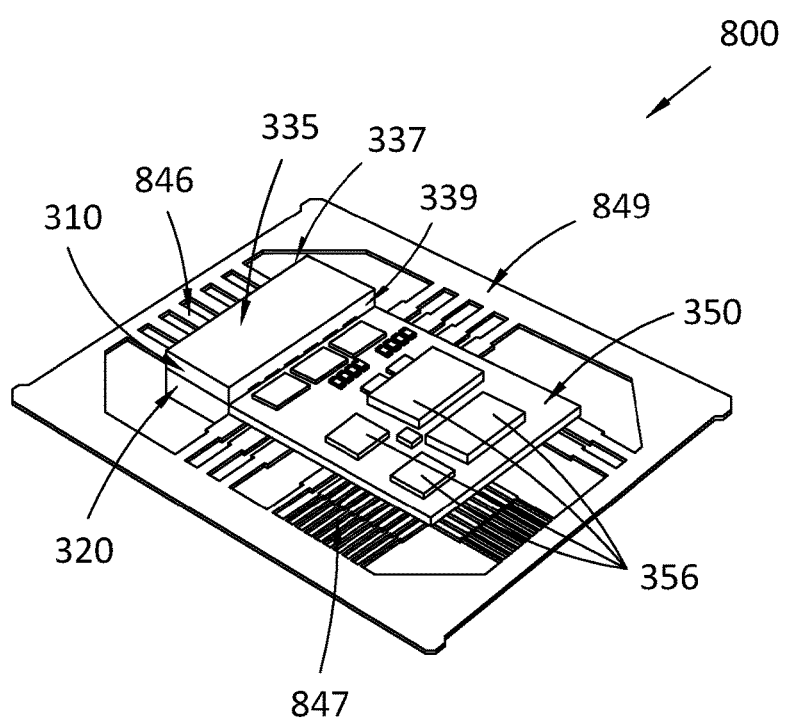
FIG. 8 is a schematic, top view of an electronic module package structure in accordance with an embodiment of the invention.

FIG. 8 is a schematic, top view of an electronic module package structure in accordance with an embodiment of the invention. As shown in FIG. 8, with reference to FIG. 3C, the electronic module package structure 800 includes a lead frame 849, magnetic device having a magnetic body 335 and a substrate 350 having circuits therein. The magnetic device may comprise an inductor or choke. In an embodiment of a method of forming the electronic module package structure 800, the lead frame 849 is first formed and includes at least one metal strip 846 and a plurality of metal leads 847. Next, the magnetic body 335 can be formed by disposing an I core 310 on a U core 320 having at least one metal strip 846 embedded therein. In an embodiment, the at least one metal strip 846 extends out from a first lateral surface 337 of the magnetic body 335. Next, the substrate 350 is disposed on the lead frame 849 surrounded by the at least one metal strip 845 and the plurality of metal leads 847. The substrate 350, includes a plurality of contacts (not shown) that are electrically connected to one end of each of the plurality of metal leads 847 and one end of each of the at least one metal strip 846. The other end of each of the plurality of metal leads 847 and the other end of each of the at least one metal strip 846 are used for connecting with an external circuit. The substrate 350 may comprise a PCB or a ceramic substrate, metallic substrate or a lead frame and can be a two-layered or multi-layered substrate. The substrate 350 may comprise electronic devices 356 and the electronic devices 356 can be passive and active devices used in any combination. The electronic devices 356 can be disposed on a top and bottom surface of the substrate 350, respectively.

Still referring to the electronic module package structure 800 of FIG. 8, in another embodiment, the lead frame 849 may include six metal strips along with the plurality of metal leads 847, but, the invention is not limited thereto. The lead frame may also include a plurality of metal strips. In a further embodiment, each metal strip 846 may correspond to a portion of the first and second magnetic cores to form an inductor, wherein a groove is located between each two corresponding portions of the magnetic cores. In still yet further embodiments, the electronic module package structure 800 including the lead frame 849, magnetic device having a magnetic body 335 and substrate 350 having circuits therein, is encapsulated in a molding body (not shown). Also, the molding body may entirely encapsulate the package structure 800, or partially encapsulate the package structure 800, wherein a top surface of the magnetic body 335 is exposed to the outside of the molding body. In another embodiment, the electronic module package structure 800 including the lead frame 849, magnetic device having a magnetic body 335, substrate 350 having circuits therein, and molding body, further includes a heat sink (not shown), disposed on top of the molding body. Also, in a further embodiment, the electronic module package structure 800 including the lead frame 849, magnetic device having a magnetic body 335, substrate 350 having circuits therein, molding body, and heat sink disposed on top of the molding body, further includes a thermal interface material is disposed on top of the magnetic device 335, between the magnetic device 335 and the heat sink.

In the embodiments described above, the total layout area for the system design for the electronic modules is relatively small, thus, circuit designs are less complex and overall power density can be raised. Additionally, with circuit design less complex, it is easier to reduce parasitic effects, thus, raising system efficiency. Meanwhile, due to less soldering connections, resistance is relatively decreased, resulting in less efficiency conversion losses. Also, in the embodiments with the addition of the molding body, the magnetic device, substrate, and electronic devices, respectively, can be protected from damage due to pressure and moisture. Additionally, the molding body provides a more efficient heat dissipation path for the electronic devices. Meanwhile, in the embodiments with the top surface of the magnetic body exposed to the outside of the molding body, the molding body can be exposed to an adhesive, thus, reducing adhesive shrinkage following packaging. Also, in the embodiments, should it be required, a heat sink may also be disposed on top of the molding body for improved heat dissipation of the electronic modules. Additionally, a thermal interface material can be disposed on top of the magnetic device, between the magnetic device and the heat sink to increase the heat dissipation area of the magnetic device.

From the foregoing it will be appreciated that, although specific embodiments have been described herein for purposes of illustration, various modifications can be made without deviating from the spirit and scope of the disclosure. Furthermore, where an alternative is disclosed for a particular embodiment, this alternative may also apply to other embodiments even if not specifically stated.

What is claimed is:

1. An electronic module, comprising:
a magnetic device, comprising a body having a top surface, a bottom surface, a first lateral surface and a second lateral surface opposite to the first lateral surface, wherein the magnetic device comprises a first lead and a second lead, wherein the second lead is extended outside of the body from the second lateral surface; and
a substrate, having a top surface and a bottom surface, wherein at least one electronic device is disposed on the top surface or the bottom surface of the substrate, wherein the substrate and the second lead are located at a same lateral side of the body of the magnetic device with respect to the second lateral surface, wherein the second lead is extended from the second lateral surface of the body to the substrate to electrically connect the magnetic device to the substrate, wherein the first lead of the magnetic device is not in contact with the substrate and is used for connecting with an external circuit.

2. The electronic module of claim 1, wherein the magnetic device is an inductor and the body is a magnetic body.

3. The electronic module of claim 2, wherein the first lead is extended outside of the body from the first lateral surface.

4. The electronic module of claim 2, wherein a coil is embedded inside of the magnetic body, wherein the first and the second lead are respectively electrically connected to two ends of the coil.

5. The electronic module of claim 2, wherein a metal strip embedded in the magnetic body to form the inductor, and the first lead and the second lead are integrally formed with the metal strip.

6. The electronic module of claim 1, wherein the body is a magnetic body, wherein a plurality of metal strips embedded in the magnetic body, wherein one end of each of the embedded metal strip extends out from the first lateral surface of the magnetic body and the other end of each of the embedded metal strip extends out from the second lateral surface and electrically connects with the substrate.

7. The electronic module of claim 6, wherein a groove is located on a top surface of the magnetic body between each two adjacent metal strips.

8. The electronic module of claim 2, wherein at least one metal strip is embedded in the magnetic body, and the magnetic body comprises an I core and a U core, and wherein the at least one metal strip is embedded inside of the U core with the I core disposed on the U core.

9. The electronic module of claim 2, wherein the substrate is a PCB or a ceramic substrate, metallic substrate or a lead frame.

10. The electronic module of claim 1, further comprising a molding body encapsulating the magnetic body and the substrate.

11. The electronic module of claim 1, wherein the electronic module is connected to a motherboard with a bottom surface of the magnetic body facing a top surface of the motherboard, wherein the first lead and a third lead disposed on the substrate are electrically connected to an external motherboard.

12. The electronic module of claim 1, wherein the magnetic device is an inductor.

13. The electronic module of claim 2, wherein the first lead is extended outside of the body from the bottom surface of the body of the magnetic device.

14. An electronic module, comprising:
an inductor, comprising a magnetic body having a top surface, a bottom surface, a first lateral surface and a second lateral surface opposite to the first lateral surface, wherein the inductor comprises a first lead and a second lead, wherein the first lead is extended outside of the magnetic body from the first lateral surface and the second lead is extended outside of the magnetic body from the second lateral surface; and
a substrate, having a top surface and a bottom surface, wherein at least one electronic device is disposed on the top surface or the bottom surface of the substrate, wherein the second lead is extended from the second lateral surface of the magnetic body to the substrate to electrically connect the inductor to the substrate, wherein the first lead of the inductor is not in contact with the first substrate and is used for connecting with an external circuit.

15. The electronic module of claim 14, wherein the substrate is a PCB or a ceramic substrate, metallic substrate or a lead frame.

16. The electronic module of claim 14, wherein a coil is embedded inside of the magnetic body, wherein the first and the second lead are respectively electrically connected to two ends of the coil.

17. The electronic module of claim 14, wherein a metal strip is embedded in the magnetic body to form an inductor, and the first lead and the second lead are integrally formed with the metal strip embedded in the magnetic body.

* * * * *